United States Patent [19]

Roh

[11] Patent Number: 5,545,582
[45] Date of Patent: Aug. 13, 1996

[54] METHOD FOR MANUFACTURING SEMICONDUCTOR DEVICE CAPACITOR

[75] Inventor: Jun-yong Roh, Kyungki-do, Rep. of Korea

[73] Assignee: Samsung Electronics Co., Ltd., Suwon, Rep. of Korea

[21] Appl. No.: 365,446

[22] Filed: Dec. 28, 1994

[30] Foreign Application Priority Data

Dec. 31, 1993 [KR] Rep. of Korea ............... 93-32282

[51] Int. Cl.⁶ .......................................... H01L 21/8242
[52] U.S. Cl. ........................... 437/52; 437/60; 437/919
[58] Field of Search .................. 437/47, 48, 52, 437/60, 919; 257/307

[56] References Cited

U.S. PATENT DOCUMENTS

| | | | |
|---|---|---|---|
| 5,061,650 | 10/1991 | Dennison et al. | 437/60 |
| 5,084,405 | 1/1992 | Fazam et al. | 437/60 |
| 5,102,820 | 4/1992 | Chuba | 437/52 |
| 5,137,842 | 8/1992 | Cham et al. | 437/52 |
| 5,164,881 | 11/1992 | Ahan | 437/52 |
| 5,236,859 | 8/1993 | Bae et al. | 437/52 |
| 5,278,091 | 1/1994 | Fazam et al. | 437/60 |

*Primary Examiner*—Tom Thomas

[57] ABSTRACT

A method for manufacturing a semiconductor device capacitor includes the steps of forming a first conductive layer on a semiconductor substrate, forming a storage node pattern on the first conductive layer, forming first conductive sidewalls on the side surfaces of the storage node pattern, removing the storage node pattern, forming material sidewalls on the side surfaces of the conductive sidewalls, forming second conductive sidewalls on the side surfaces of the material sidewalls, and removing the material sidewalls. Thus, a process simplification is achieved and capacitance is increased easily so that a high-integration memory cell can be ensured.

14 Claims, 3 Drawing Sheets

METHOD FOR MANUFACTURING SEMICONDUCTOR DEVICE CAPACITOR

BACKGROUND OF THE INVENTION

The present invention relates to a method for manufacturing a semiconductor device capacitor. More particularly, the present invention relates to a method for readily manufacturing a semiconductor device capacitor having increased capacitance.

As integration of dynamic random access memory (DRAM) devices increases, various methods for forming the memory cell capacitor structure in three dimensions have been proposed which increase capacitance in the evermore restricted area apportioned to each memory cell. Among the proposed three-dimensional capacitor structures, the cylindrical capacitor structure has typically been adopted for use in semiconductor memory devices having an overall memory size in excess of 64 Mbits. This selection has been made because the interior surface of the cylinder structure as well as the outer surface thereof can be utilized as an effective capacitor area.

FIG. 1 is a section view illustrating a method for manufacturing a cylindrical capacitor structure according to a conventional method. Referring to FIG. 1, a silicon nitride layer 11 is formed over a semiconductor substrate 1 proximate a transistor and a bit line 10. Then, an oxide film pattern 16 is formed in this region expect for an area wherein a capacitor storage node will subsequently be formed. A polysilicon sidewall electrode 17 is formed over the resultant structure, and the area in which the capacitor storage node structure, and the area in which the capacitor storage node will be formed is filled with a photoresist 18. An upper portion of polysilicon sidewall electrode 17 overlaying the oxide film pattern 16 is etched away, and oxide film pattern 16 and photoresist 18 are thereafter removed.

In a highly integrated memory cell, spacing between adjacent cells must be minimized in order to increase the capacitance of the memory cell capacitor by maximizing the capacitor's surface area. As seen in the above-described conventional method, individual memory cell capacitance is restricted by the size, i.e., the width, of oxide film pattern 16 which is used to separate adjacent capacitors. In the foregoing conventional method, the minimally obtainable width of oxide film pattern 16 is limited by the exposure line width of a photo-lithography process.

A crown-shaped cell structure proposed by Toru Kaga et al. provides increased capacitance by forming a crown-shaped cylindrical electrode having double walls. See, "Crown-shaped Stacked-capacitor Cell for 1.5 V Operation 64 Mb DRAMs," *IEEE Transactions on Electron Devices*, 1991.

The method for manufacturing the crown-shaped cell is generally characterized as follows. First, a first polysilicon layer is formed on a semiconductor substrate on which an oxide film pattern defines the area in which a capacitor storage node is to be formed. Then, an oxide film spacer is formed on the sidewalls of the first polysilicon layer. Then, a second polysilicon layer is formed, and a groove formed by the second polysilicon is filled with an oxide film. The first and second polysilicon layers are etched using the oxide films as an etching block layer, to thereby form a double-cylindrical storage node.

However, in the foregoing method for manufacturing a crown-shaped cell, it is still impossible to form an oxide film pattern defining the area in which a storage node is to be formed having a size smaller than the limiting exposure line width. Therefore, the space between adjacent capacitors cannot be effectively reduced. Moreover, in the foregoing method for manufacturing a crown-shaped cell, an additional process step of filling the groove formed by the second polysilicon layer is required in order to prevent the connection point between the semiconductor substrate and the storage node from being etched away.

SUMMARY OF THE INVENTION

Accordingly, it is an object of the present invention to provide a method for manufacturing a semiconductor device capacitor having increased cell capacitance.

To accomplish the above object of the present invention, there is provided a method for manufacturing a semiconductor device capacitor, comprising the sequential steps of: (a) forming a first conductive layer on a semiconductor substrate; (b) forming a storage node pattern on the first conductive layer; (c) forming first conductive sidewalls on the side surfaces of the storage node pattern; (d) removing the storage node pattern; (e) forming material sidewalls on the side surfaces of the first conductive sidewalls; (f) forming second conductive sidewalls on the side surfaces of the material sidewalls; and (g) removing the material sidewalls.

According to an embodiment of the present invention, the thickness of the material sidewalls must be controlled so as to fill the space between the first conductive sidewalls. As for the material used to form the storage node pattern and the material sidewalls, it is desirable that such material have an etching rate different from that of the material used to form the first conductive layer and the first and second conductive sidewalls, with respect to an arbitrary anisotropic etching.

According to the present invention, first conductive sidewalls are formed by employing the storage node pattern formed by a mask for forming a storage node. Then, material sidewalls are formed on the side surfaces of first conductive sidewalls. Then, second conductive sidewalls are formed on the side surfaces of the material sidewalls. Thus, a double-cylindrical capacitor structure is formed in a method which allows the space between adjacent capacitors to be reduced to a width less than a limited exposure line width.

BRIEF DESCRIPTION OF THE DRAWINGS

The above objects and other advantages of the present invention will become more apparent upon consideration of a preferred embodiment thereof with reference to the attached drawings in which.

DETAILED DESCRIPTION OF THE INVENTION

Figure 1:
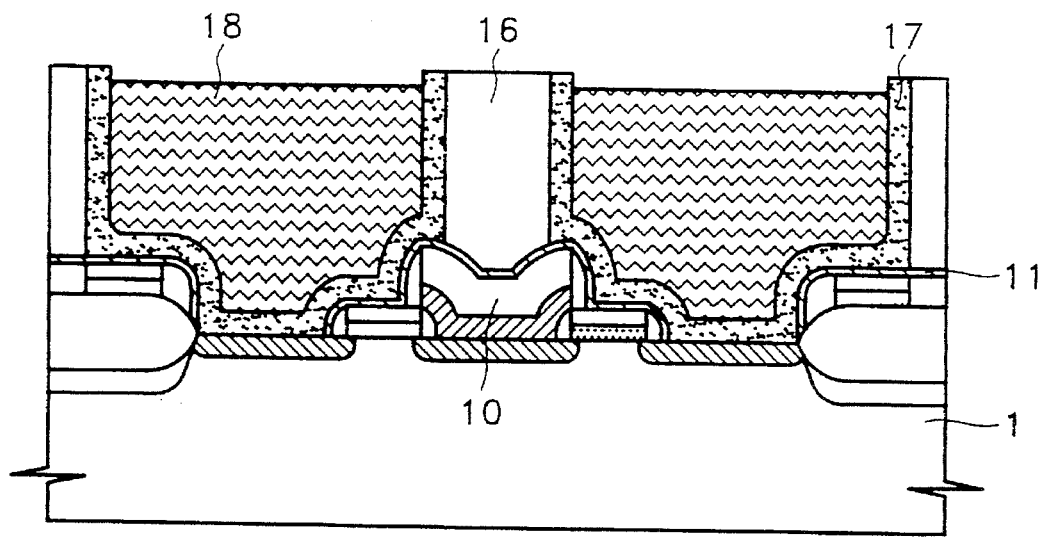
FIG. 1 is a section view of a semiconductor device capacitor manufactured according to a conventional method.
Figure 2:
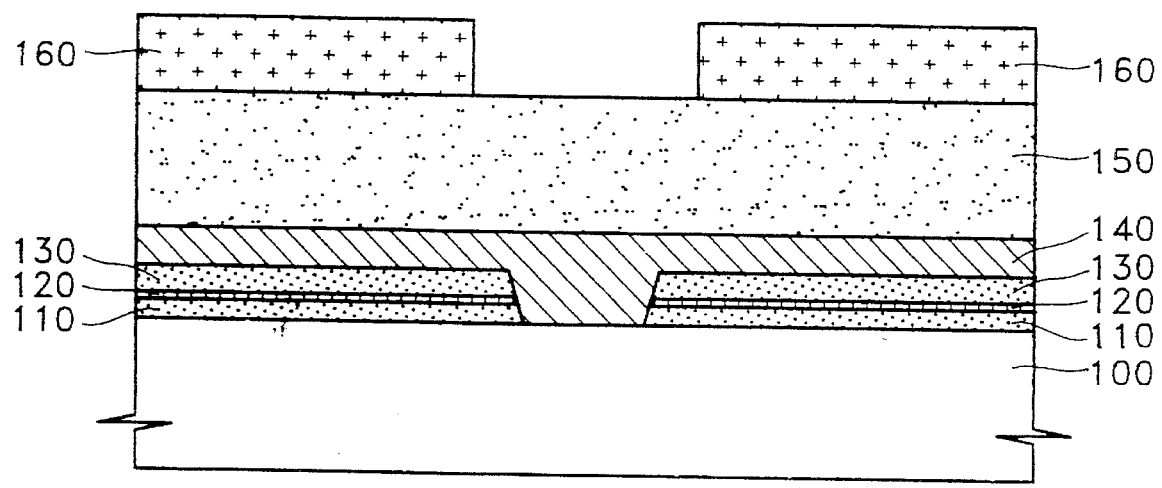
FIG. 2 to FIG. 6 are section views illustrating a method for manufacturing a semiconductor device capacitor according to the present invention.

FIG. 2 shows the steps of forming a first conductive layer 140, a first material layer 150 and a photoresist pattern 160 atop and proximate a contact hole structure exposing a semiconductor substrate 100. First, in order to provide insulation for the lower structure, for example, a transistor or bit line formed on the substrate, an insulating layer 110 is formed by depositing an insulating material on substrate 100. Then, silicon nitride is deposited on insulating layer 110, thereby forming an etching blocking layer 120. Then, an oxide is deposited on etching blocking layer 120, thereby forming a sacrificial material layer 130. Here, it is desirable to form etching blocking layer 120 of a material whose etching rate is lower than that of the material constituting the sacrificial material layer 130, with respect to a wet etching method for the subsequent removal of sacrificial material layer 130.

Once the foregoing structure is complete a photolithography process removes a predetermined portion of sacrificial material layer 130, etching blocking layer 120 and insulating layer 110, thereby forming a contact hole (not shown in detail) for connecting the capacitor storage node to substrate 100.

Next, a conductive material, for example, an impurity-doped polysilicon, is deposited on the resultant structure where the contact hole is formed, to thereby form a first conductive layer 140. At this time, the polysilicon can be deposited thickly and etched back in order to achieve a planarized surface. Sequentially, a first material, for example, oxide is deposited on first conductive layer 140, to thereby form a first material layer 150. Here, it is desirable that the material employed as first material layer 150 have an excellent etching selectivity with respect to the material constituting first conductive material 140; say, greater than 4:1, for example. Then, to define the area in which a capacitor storage node is Go formed, a photoresist pattern 160 is formed by a photo-lithography process on first material layer 150.

Figure 3:
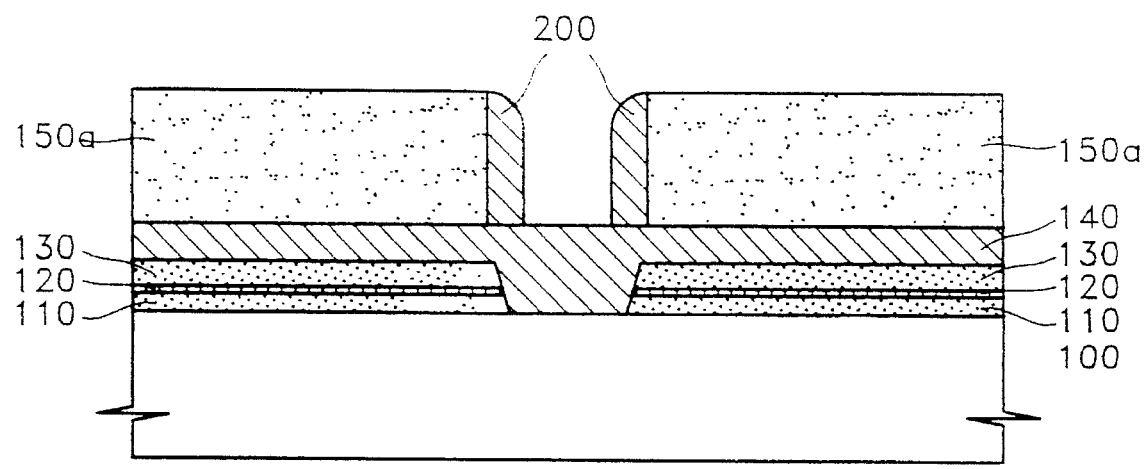

FIG. 3 shows the steps of forming a storage node pattern 150a and first conductive sidewalls 200. First material layer 150 is anisotropically etched employing photoresist pattern 160 shown in FIG. 2 as an etching mask. Thus, storage node pattern 150a comprises the residual portion(s) of first material layer 150 excluding the portion in which the storage node is to be formed. Here, due to the aforementioned high selectively ratio, first conductive layer 140 serves as an etch-blocking layer when first material layer 150 is anisotropically etched, so that even if the first conductive layer 140 is over-etched during the anisotropic etching process use to form the storage node pattern, no damage occurs to the lower first conductive layer 140 where the storage node will subsequently be connected with semiconductor substrate 100.

Then, the photoresist pattern 160 is removed by a washing method. Then, an impurity-doped polysilicon is deposited as a conductive material on the resultant structure, to thereby form a second conductive layer (not shown). Then, the second conductive layer is anisotropically etched and first conductive sidewalls 200 are formed on the side surfaces of storage node pattern 150a.

Figure 4:
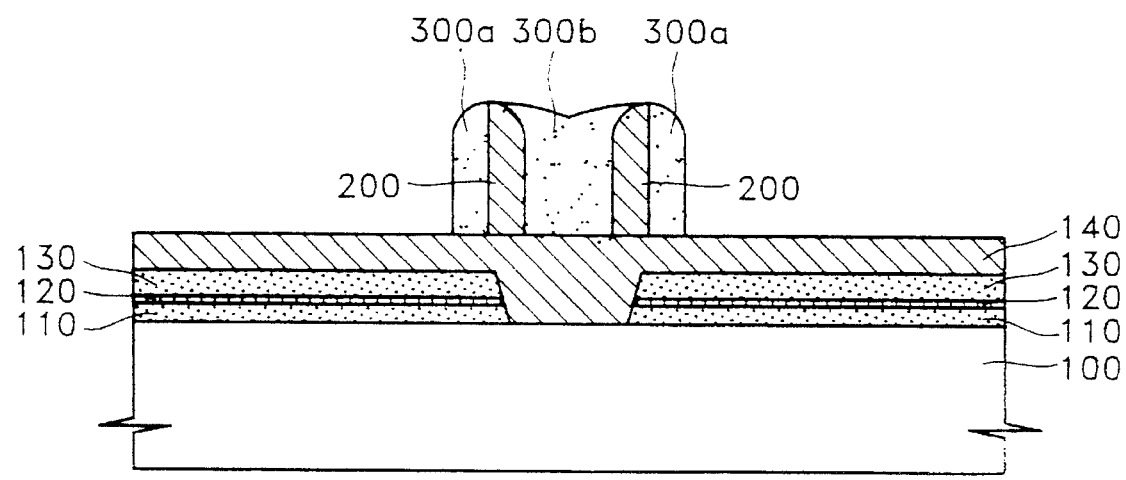

FIG. 4 shows the steps of forming material sidewalls 300a and 300b. The storage node pattern (reference numeral 150a of FIG. 3) is etched away and an oxide material is deposited on the resultant structure, to thereby form a second material layer (not shown). Here, it is desirable to form the second material layer of a material having an excellent etching selectivity with respect to the material constituting the first conductive layer and first conductive sidewalls, in consideration of an arbitrary anisotropic etching process.

Then, the second material is anisotropically etched and material sidewalls 300a and 300b consisting of the second material layer are formed on the side surfaces of first conductive sidewalls 200. Here, first conductive layer 140 serves as an etch-blocking layer. The thickness of the material sidewalls must be controlled so that the space between first conductive sidewalls 200 can be completely filled.

Figure 5:
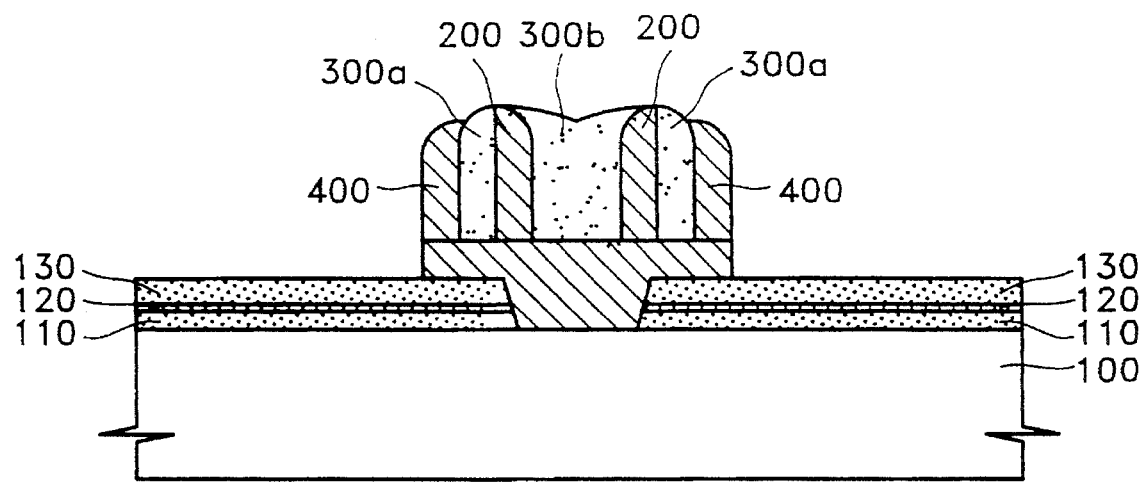

FIG. 5 shows the steps for forming second conductive sidewalls 400. A conductive material, an impurity-doped polysilicon, is deposited on the resultant structure where material sidewalls 300a and 300b are formed, to thereby form a third conductive layer (not shown). Then, the second conductive layer is anisotropically etched and second conductive sidewalls 400 are formed on the side surfaces of material sidewalls 300a and 300b. At this time, first conductive layer 140 is also etched and thereby divided into cell units. Sacrificial oxide layer 130 serves as an etch-blocking layer when the second conductive layer is anisotropically etched.

Figure 6:
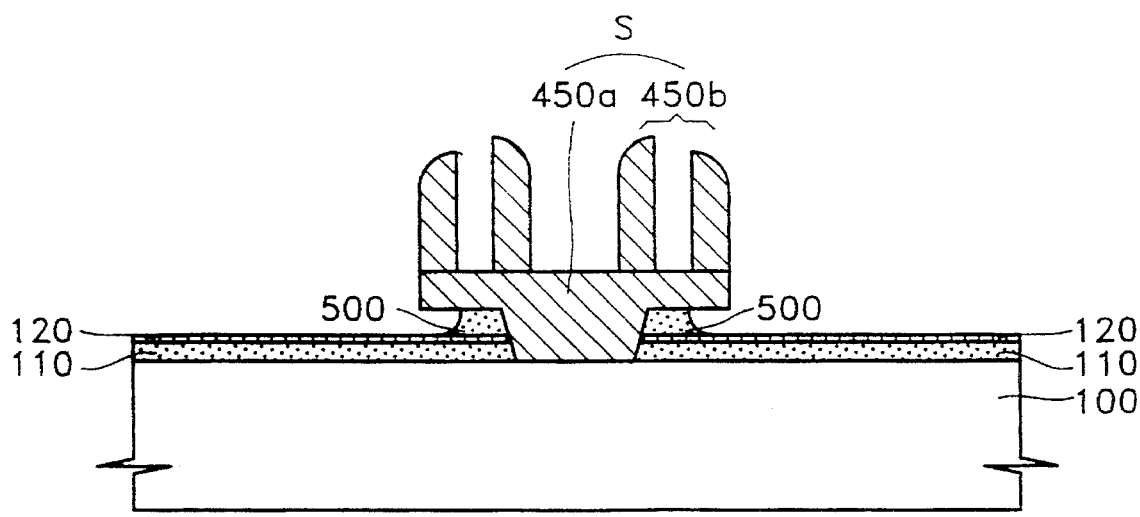

FIG. 6 shows the steps for forming a storage node structure S. A wet etching is performed employing a surfactant-buffered oxide etchant (SBOE: mixture of $NH_4$ and HF) on the resultant structure where second conductive sidewalls 400 are formed. Then, the material sidewalls (reference numerals 300a and 300b of FIG. 5) and the sacrificial oxide layer (reference numeral 130 of FIG. 5) are removed. As a result, the storage node structure S consisting of a pillar electrode 450a coupled to semiconductor substrate 100 and a double-cylindrical electrode 450b is formed. Here, some of sacrificial oxide layer 130 may remain under the bottom surface of pillar electrode 450a or may be completely removed.

Then, a high dielectric material, for example, oxide/nitride/oxide (ONO) or $Ta_2O_5$, is deposited over the entire storage node S, to thereby form a dielectric film (not shown). Sequentially, a conductive material, for example, an impurity-doped polysilicon, is deposited over the dielectric film and thus a plate node (not shown) is formed. As a result, a double cylindrical capacitor can be obtained.

As described above, according to the present invention, a storage node pattern is formed by employing a mask for forming a storage node, and first conductive sidewalls are formed employing the storage node pattern. Then, material sidewalls are formed on the side surfaces of first conductive sidewalls. Then, second conductive sidewalls are formed on the side surfaces of the material sidewalls. Accordingly, the space between the adjacent capacitors is reduced to a width less than the limited exposure line width, thereby increasing capacitance.

In addition, an additional process for protecting the portion where the storage node and semiconductor substrate are interconnected is not required since the material sidewalls on the side surfaces of the first conductive sidewalls, formed in order to form the second conductive sidewalls, fills the space formed between the first conductive sidewalls. Accordingly, the capacitance required for a high integration memory cell can be easily attained by a simpler manufacturing process.

It is understood by those skilled in the art that the foregoing description is a preferred embodiment of the present invention, and that various changes and modifications may be made in the foregoing specific example without departing from the spirit and scope of the attached claims.

What is claimed is:

1. A method for manufacturing a semiconductor device capacitor comprising the steps of:

(a) forming a first conductive layer over a major surface of a semiconductor substrate;

(b) forming a first material layer over the first conductive layer;

(c) patterning the first material layer to form a storage node pattern;

(d) forming first conductive sidewalls within the storage node pattern, each first conductive sidewall having an interior surface and an exterior surface and formed in electrical contact with the first conductive layer;

(e) removing the first material layer;

(f) forming material sidewalls on the interior and exterior surfaces of the first conductive sidewalls;

(g) forming a second conductive sidewall on a side surface of the material sidewalls;

(h) removing portions of the first conductive layer not covered by the combination of the first and second conductive sidewalls and the material sidewalls; and (i) etching away the second material sidewalls using a surfactant-buffered oxide etchant.

2. The method for manufacturing a semiconductor device capacitor recited in claim 1, wherein step (a) further comprises the step of: forming the first conductive layer in contact with the semiconductor substrate through a contact hole.

3. The method for manufacturing a semiconductor device capacitor recited in claim 2, wherein step (c) further comprises the steps of:

(h) forming a photoresist layer on the first material layer;

(i) patterning the photoresist layer to form a photoresist pattern; and, (j) etching the first material layer using the photoresist pattern to form the storage node pattern having a recess in the first material layer, the recess exposing a portion of the first conductive layer proximate the contact hole.

4. The method for manufacturing a semiconductor device capacitor recited in claim 3, wherein step (d) further comprises the steps of:

(k) depositing a second conductive layer over the storage node pattern;

(l) etching the second conductive layer to form spaced-apart, first conductive sidewalls orthogonally disposed in relation to the first conductive layer overlaying the major semiconductor surface.

5. The method for manufacturing a semiconductor device capacitor recited in claim 4, wherein step (f) further comprises the steps of:

(m) depositing a second material layer over the combination of the first conductive layer and the first conductive sidewalls;

(n) etching the second material layer, using the first conductive layer as an etch blocking layer, to form a first material sidewall disposed between facing interior surfaces of the first conductive sidewalls, and a second material sidewall respectively formed on the exterior surface of each first conductive sidewall.

6. The method for manufacturing a semiconductor device capacitor recited in claim 5, wherein step (g) further comprises the steps of:

(o) depositing a third conductive layer over the structure resulting from step (n);

(p) etching the third conductive layer to form second conductive sidewalls orthogonally disposed in parallel with the first conductive sidewalls and respectively spaced apart from a corresponding surface of a first conductive sidewall by a second material sidewall.

7. The method for manufacturing a semiconductor device capacitor recited in claim 1, further comprising the steps of:

depositing a dielectric material over the structure resulting from step (i); and depositing a fourth conductive layer over the dielectric material layer.

8. A method for manufacturing a semiconductor device capacitor comprising the steps of:

(a) forming a first conductive layer over a major surface of a semiconductor substrate;

(b) forming a first material layer on the first conductive layer, wherein the first material layer has an etch selectivity higher than that of the first conductive layer;

(c) patterning the first material layer to form a storage node pattern;

(d) forming first conductive sidewalls, each having an interior facing surface and an exterior surface, in electrical contact with the first conductive layer within the storage node pattern;

(e) removing the first material layer;

(f) forming material sidewalls on the interior and exterior surfaces of the first conductive sidewalls;

(g) forming second conductive sidewalls on side surfaces of the material sidewalls (h) removing portions of the first conductive layer not covered by the combination of the first and second conductive sidewalls and the material sidewalls; and, (i) etching away the second material sidewalls using a surfactant-buffered oxide etchant.

9. The method for manufacturing a semiconductor device capacitor recited in claim 8, wherein step (c) further comprises the steps of:

(h) forming a photoresist layer on the first material layer;

(i) patterning the photoresist layer to form a photoresist pattern; and, (j) etching the first material layer, using the photoresist pattern and using the first conductive layer as an etch blocking layer, to form the storage node pattern.

10. The method for manufacturing a semiconductor device capacitor recited in claim 9, wherein step (d) further comprises the steps of:

(k) depositing a second conductive layer over the patterned first material layer;

(l) etching the second conductive layer to form first conductive sidewalls.

11. The method for manufacturing a semiconductor device capacitor recited in claim 10, wherein step (f) further comprises the steps of:

(m) depositing a second material layer having a high etch selectivity with respect to the first conductive layer over the combination of the first conductive layer and the first conductive sidewalls;

(n) etching the second material layer, using the first conductive layer as an etch blocking layer, to form a first material sidewall disposed between facing interior surfaces of the first conductive sidewalls, and a second material sidewall respectively formed on the exterior surface of each first conductive sidewall.

12. The method for manufacturing a semiconductor device capacitor recited in claim 11, further comprising the step of:

(o) etching away the first and second material sidewalls.

13. A method for manufacturing a semiconductor device capacitor comprising the steps of:

(a) forming an etch blocking layer over a semiconductor substrate;

(b) forming a sacrificial oxide layer over the etch blocking layer;

(c) forming a contact hole through the etch blocking layer and the sacrificial oxide layer;

(d) forming a first conductive layer over the sacrificial oxide layer in electrical contact with the semiconductor substrate through the contact hole;

(e) forming a first material layer on the first conductive layer;

(f) patterning the first material layer to form a storage node pattern having a recess over at least a portion of the contact hole;

(g) forming spaced-apart first conductive sidewalls within the recess of the storage node pattern, each first conductive sidewall having an interior surface and an exterior surface;

(h) removing the first material layer;

(i) forming material sidewalls on the interior and exterior surfaces of the first conductive sidewalls;

(j) forming a second conductive sidewall on a side surface of the material sidewalls;

(i) removing portions of the first conductive layer not covered by the combination of the first and second conductive sidewalls and the material sidewalls to form a pedestal-shaped capacitor structure above the semiconductor substrate; and, (j) etching away the material sidewalls and at least a portion of the sacrificial oxide layer using the etch blocking layer as an etch stopper.

14. The method for manufacturing a semiconductor device capacitor recited in claim 13, wherein the first material layer has an etch selectivity rate higher than that of the first conductive layer.

* * * * *